(12) United States Patent
Zhu et al.

(10) Patent No.: US 9,905,687 B1
(45) Date of Patent: Feb. 27, 2018

(54) SEMICONDUCTOR DEVICE AND METHOD OF MAKING

(71) Applicant: NXP USA, INC., Austin, TX (US)

(72) Inventors: Ronghua Zhu, Chandler, AZ (US); Xin Lin, Phoenix, AZ (US); Jiang-Kai Zuo, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/435,694

(22) Filed: Feb. 17, 2017

(51) Int. Cl.
| | | |
|---|---|---|
| *H01L 29/78* | (2006.01) | |
| *H01L 29/06* | (2006.01) | |
| *H01L 29/66* | (2006.01) | |
| *H01L 29/423* | (2006.01) | |
| *H01L 27/092* | (2006.01) | |
| *H01L 29/417* | (2006.01) | |
| *H01L 29/40* | (2006.01) | |
| *H01L 29/10* | (2006.01) | |
| *H01L 29/08* | (2006.01) | |
| *H01L 27/088* | (2006.01) | |

(Continued)

(52) U.S. Cl.
CPC ........ *H01L 29/7816* (2013.01); *H01L 27/088* (2013.01); *H01L 27/0922* (2013.01); *H01L 29/063* (2013.01); *H01L 29/0649* (2013.01); *H01L 29/0653* (2013.01); *H01L 29/0692* (2013.01); *H01L 29/0847* (2013.01); *H01L 29/1045* (2013.01); *H01L 29/1095* (2013.01); *H01L 29/401* (2013.01); *H01L 29/41758* (2013.01); *H01L 29/4238* (2013.01); *H01L 29/42368* (2013.01); *H01L 29/66659* (2013.01); *H01L 29/66674* (2013.01); *H01L 29/66681* (2013.01); *H01L 29/7801* (2013.01); *H01L 29/7802* (2013.01); *H01L 29/7833* (2013.01); *H01L 29/7835* (2013.01); *H01L 21/823456* (2013.01); *H01L 21/823493* (2013.01); *H01L 21/823892* (2013.01)

(58) Field of Classification Search
CPC ............ H01L 29/7835; H01L 29/7816; H01L 29/66659; H01L 29/42368; H01L 29/0653; H01L 29/0847; H01L 29/1045; H01L 29/1095; H01L 29/66681; H01L 29/0692; H01L 29/7802; H01L 27/088; H01L 27/0922; H01L 29/41758; H01L 29/4238; H01L 29/7801; H01L 21/823456; H01L 21/823493; H01L 21/823892; H01L 29/401; H01L 29/66674; H01L 29/063; H01L 29/0649; H01L 29/7833

See application file for complete search history.

(56) References Cited

U.S. PATENT DOCUMENTS

| 5,216,275 A | 6/1993 | Chen |
| 5,386,136 A | 1/1995 | Williams et al. |
| 5,438,215 A | 8/1995 | Tihanyi |

(Continued)

OTHER PUBLICATIONS

U.S. Appl. No. 15/171,047, Inventor Xin Lin, "Semiconductor Device and Method of Making", filed Jun. 2, 2016, Office Action—Non-Final Rejection.

(Continued)

*Primary Examiner* — Bac Au

(57) ABSTRACT

Laterally diffused metal-oxide-semiconductor (LDMOS) device is disclosed. The device is surrounded by an isolation ring and a buried layer of a first doping type, that is of the same type as its source and drain regions of the same doping type. A control gate of the device includes step gate dielectric.

20 Claims, 15 Drawing Sheets

(51) Int. Cl.
*H01L 21/8234* (2006.01)
*H01L 21/8238* (2006.01)

(56) References Cited

U.S. PATENT DOCUMENTS

| | | | |
|---|---|---|---|
| 5,923,071 | A | 7/1999 | Saito |
| 5,932,897 | A | 8/1999 | Kawaguchi et al. |
| 6,137,140 | A | 10/2000 | Efland et al. |
| 6,211,552 | B1 | 4/2001 | Efland et al. |
| 6,552,390 | B2 | 4/2003 | Kameda |
| 6,882,023 | B2 | 4/2005 | Khemka et al. |
| 7,282,765 | B2 | 10/2007 | Xu et al. |
| 7,466,006 | B2 | 12/2008 | Khemka et al. |
| 7,473,978 | B2 | 1/2009 | Matsudai et al. |
| 7,511,319 | B2 | 3/2009 | Zhu et al. |
| 7,535,058 | B2 | 5/2009 | Liu et al. |
| 7,569,884 | B2 | 8/2009 | Lee |
| 7,977,715 | B2 | 7/2011 | Cai |
| 8,039,902 | B2 | 10/2011 | Kim et al. |
| 8,159,029 | B2 | 4/2012 | Su et al. |
| 8,193,585 | B2 | 6/2012 | Grote et al. |
| 8,269,275 | B2 | 9/2012 | Chen et al. |
| 8,282,722 | B2 | 10/2012 | Vonwiller et al. |
| 8,304,831 | B2 | 11/2012 | Zhu et al. |
| 8,330,220 | B2 | 12/2012 | Khan et al. |
| 8,350,327 | B2 | 1/2013 | Chung et al. |
| 8,716,791 | B1 | 5/2014 | Iravani et al. |
| 8,809,952 | B2 | 8/2014 | Landgraf et al. |
| 8,853,780 | B2 | 10/2014 | Yang et al. |
| 9,136,323 | B2 | 9/2015 | Yang et al. |
| 2001/0025961 | A1 | 10/2001 | Nakamura et al. |
| 2001/0038125 | A1 | 11/2001 | Ohyanagi et al. |
| 2002/0017697 | A1 | 2/2002 | Kitamura et al. |
| 2006/0267044 | A1 | 11/2006 | Yang |
| 2007/0246771 | A1 | 10/2007 | McCormack et al. |
| 2007/0278568 | A1 | 12/2007 | Williams et al. |
| 2008/0020813 | A1 | 1/2008 | Voldman |
| 2008/0054994 | A1 | 3/2008 | Shibib et al. |
| 2008/0067615 | A1 | 3/2008 | Kim |
| 2008/0090347 | A1 | 4/2008 | Huang |
| 2008/0191277 | A1 | 8/2008 | Disney et al. |
| 2008/0246086 | A1 | 10/2008 | Korec et al. |
| 2009/0020813 | A1 | 1/2009 | Voldman |
| 2011/0127607 | A1 | 6/2011 | Cai |
| 2011/0260247 | A1 | 10/2011 | Yang et al. |
| 2012/0126323 | A1 | 5/2012 | Wu et al. |
| 2012/0126324 | A1 | 5/2012 | Takeda et al. |
| 2012/0161233 | A1 | 6/2012 | Ito |
| 2012/0205738 | A1 | 8/2012 | Yang et al. |
| 2013/0015523 | A1 | 1/2013 | You |
| 2014/0203358 | A1 | 7/2014 | Yang et al. |
| 2014/0264588 | A1 | 9/2014 | Chen et al. |

OTHER PUBLICATIONS

Ex parte Quayle Action dated Jan. 21, 2016 for U.S. Appl. No. 13/748,076, 4 pages.
Final Office Action dated Jul. 16, 2015 for U.S. Appl. No. 13/748,076, 5 pages.
Non-Final Office Action dated Dec. 26, 2014 for U.S. Appl. No. 13/748,076, 10 pages.
Notice of Allowance dated Apr. 12, 2016 for U.S. Appl. No. 13/748,076, 7 pages.
U.S. Appl. No. 15/171,047 entitled "Semiconductor Device and Method of Making," filed Jun. 2, 2016.
Notice of Allowance dated Jun. 6, 2014 for U.S. Appl. No. 13/465,761, 9 pages.
Non-Final Office Action dated Jan. 30, 2014 for U.S. Appl. No. 13/465,761, 18 pages.
Final Office Action dated Oct. 25, 2013 for U.S. Appl. No. 13/465,761, 15 pages.
Non-Final Office Action dated Jun. 27, 2013 for U.S. Appl. No. 13/465,761, 16 pages.
Restriction Requirement dated Apr. 29, 2013 for U.S. Appl. No. 13/465,761, 7 pages.
Notice of Allowance dated May 13, 2015 for U.S. Appl. No. 14/486,104, 10 pages.
Fujihira, T. et al., "Simulated Superior Performances of Semiconductor Superjunction Devices," hoc. Of the ISPSD, Jun. 1998; pp. 423-426.
Lorenz, L. et al. "COOLMOS—A New Milestone in High Voltage Power MOS," published at ISPSD, 1999; 8 pages.
Merchant, et al., "Dependence of breakdown voltage on drift length and buried oxide thickness in SOI RESURF LDMOS transistors", Proceedings of the 5th International Symposium on Power Semiconductor Devices and ICs, IEEE, 1993, pp. 124-128, ISBN 0-7803-1313-5.
Parthasarathy, V. et al., "A Double RESURF LDMOS with Drain Profile Engineering for Improved ESD Robustness," IEEE Electron Device Letter, vol. 23, No. 4, pp. 212-214 (2002).
Zhu, R. et al., "Engineering RESURF LDMOSFETs for Robust SOA, ESD Protection and Energy Capability," 19.sup.th ISPSD, pp. 185-188 (2007).
U.S. Appl. No. 15/171,047, Inventor Xin Lin, "Semiconductor Device and Method of Making", filed Jun. 2, 2016, Office Action—Restriction, dated Mar. 3, 2017.
U.S. Appl. No. 15/340,848, inventor Hongning Yang, "Semiconductor Device with Enhance 3D RESURF" filed Nov. 1, 2016, Office Action—Notice of Allowance, dated Mar. 27, 2017.

SEMICONDUCTOR DEVICE AND METHOD OF MAKING

FIELD OF THE INVENTION

The present disclosure deals generally with integrated circuit devices, and more particularly to integrated circuits having a shallow trench isolation region between a drain structure and a gate structure.

BACKGROUND OF THE DISCLOSURE

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode, as a control electrode, and source and drain electrodes, as current electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift region is provided between the channel region and the drain region to sustain high voltage drop between the transistor source and drain across a relatively long distance.

Various LDMOS devices are designed for different applications. For example, some devices needs to sustain a high voltage drop, thus they are required to possess a high breakdown voltage. On the other hand, current conduction capability might be more crucial in some applications, thus making lowering of the device on-resistance a higher priority.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
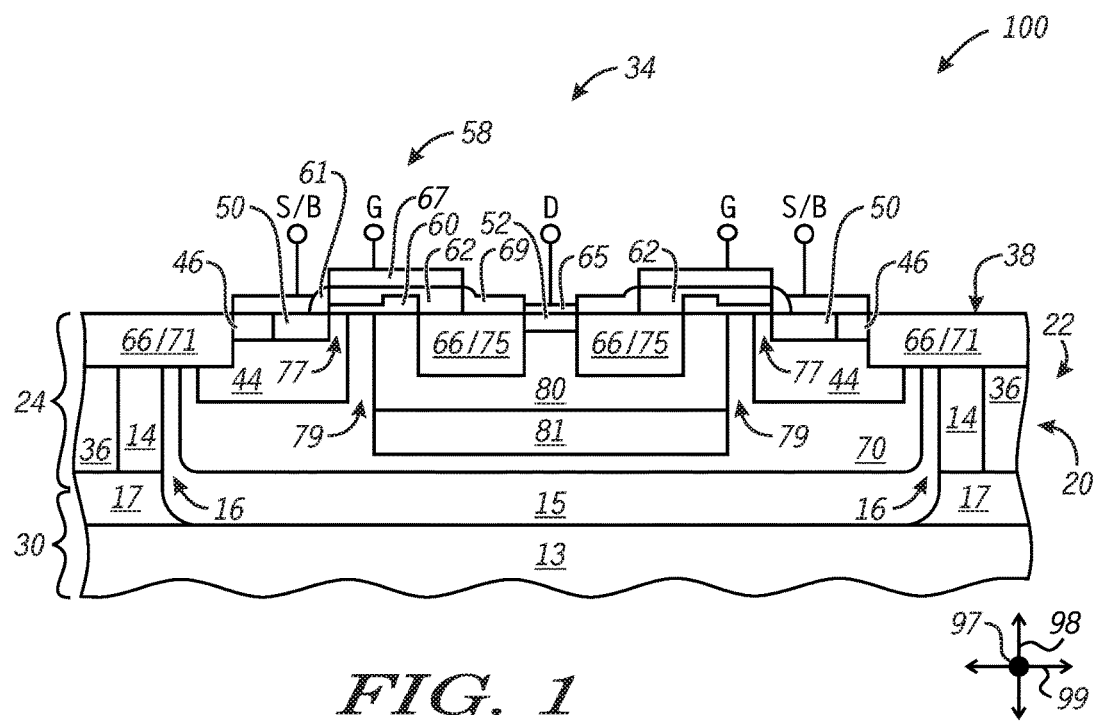
FIG. 1 illustrates a schematic cross-sectional view of a semiconductor device in accordance with a particular embodiment.

FIG. 1 is a schematic cross-sectional view of a semiconductor substrate 22 having an n-channel LDMOS device 20 constructed at a device area 34. The semiconductor substrate 22 includes a lightly doped p-type bulk substrate 13, at a level 30, having a dopant concentration in the range of $1\times10^{14}$ $cm^{-3}$ to $1\times10^{16}$ $cm^{-3}$. An n-type buried layer 15 is formed at a region above a bulk substrate portion 13 of substrate 22 to form a junction isolation region between the device area 34 and the portion 13 of a bulk substrate. The dopant concentration of the n-type buried layer can be in the range of about $1\times10^{16}$ $cm^{-3}$ to $5\times10^{19}$ $cm^{-3}$. A p-type blanket region 17 is formed at the substrate 22 to further facilitate the junction isolation between the device area 34 and the bulk substrate 13 in a lateral direction around the buried layer 15. It will be appreciated that the various regions described herein can be formed using conventional or proprietary techniques as are known to those skilled in the art. It will also be appreciated by those skilled in the art that the order in which various features are formed can vary.

The semiconductor substrate 22 includes a p-type epitaxial (p-epi) layer 24 grown on the bulk substrate 13 to reside at a level 24. The p-epi layer 24 can have an exemplary thickness in a range from 0.5 µm to 10 µm, and an exemplary dopant concentration in the range of $1\times10^{14}$ $cm^{-3}$ to $1\times10^{16}$ $cm^{-3}$. The p-epi layer can comprise silicon, germanium, other semiconductor materials, and combinations thereof. Regions of the p-epi layer 24 that maintain the original doping of p-epi layer 24 include regions 14, 70 and 79.

Figure 2:
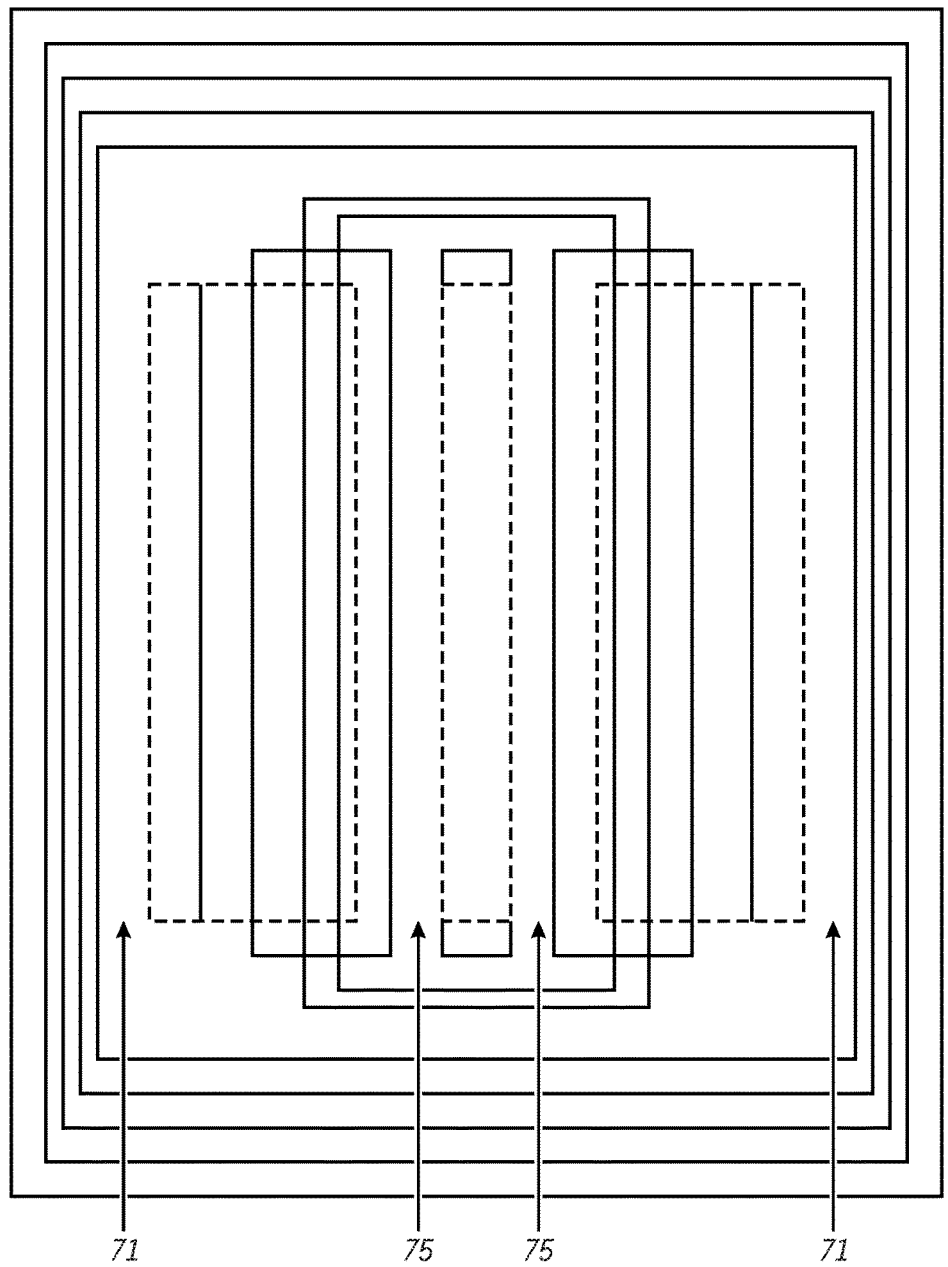
FIG. 2 illustrates the particular embodiment of FIG. 1 in plan view highlighting the location of openings in a field isolation region where active silicon is exposed.

A field isolation layer 66, which includes specifically identified features 71 and 75, is formed having a plurality of openings at which active silicon is exposed at the surface 38 of the epitaxial layer 24. The plan view of FIG. 2 illustrates three dashed rectangles, the areas of which indicate the relative location of three exposed active regions at the surface 38 of device 20. One skilled in the art will appreciate that field isolation 66 resides at the regions outside of the three dashed rectangles. The relative location of portions 71 and 75 of isolation region 66 as shown at FIG. 1 are also illustrated at FIG. 2. Because the layout of device 20 is symmetric, commonly numbered left and right versions of features 71 and 75 are illustrated, each of which will be discussed in greater detail herein.

Figure 3:
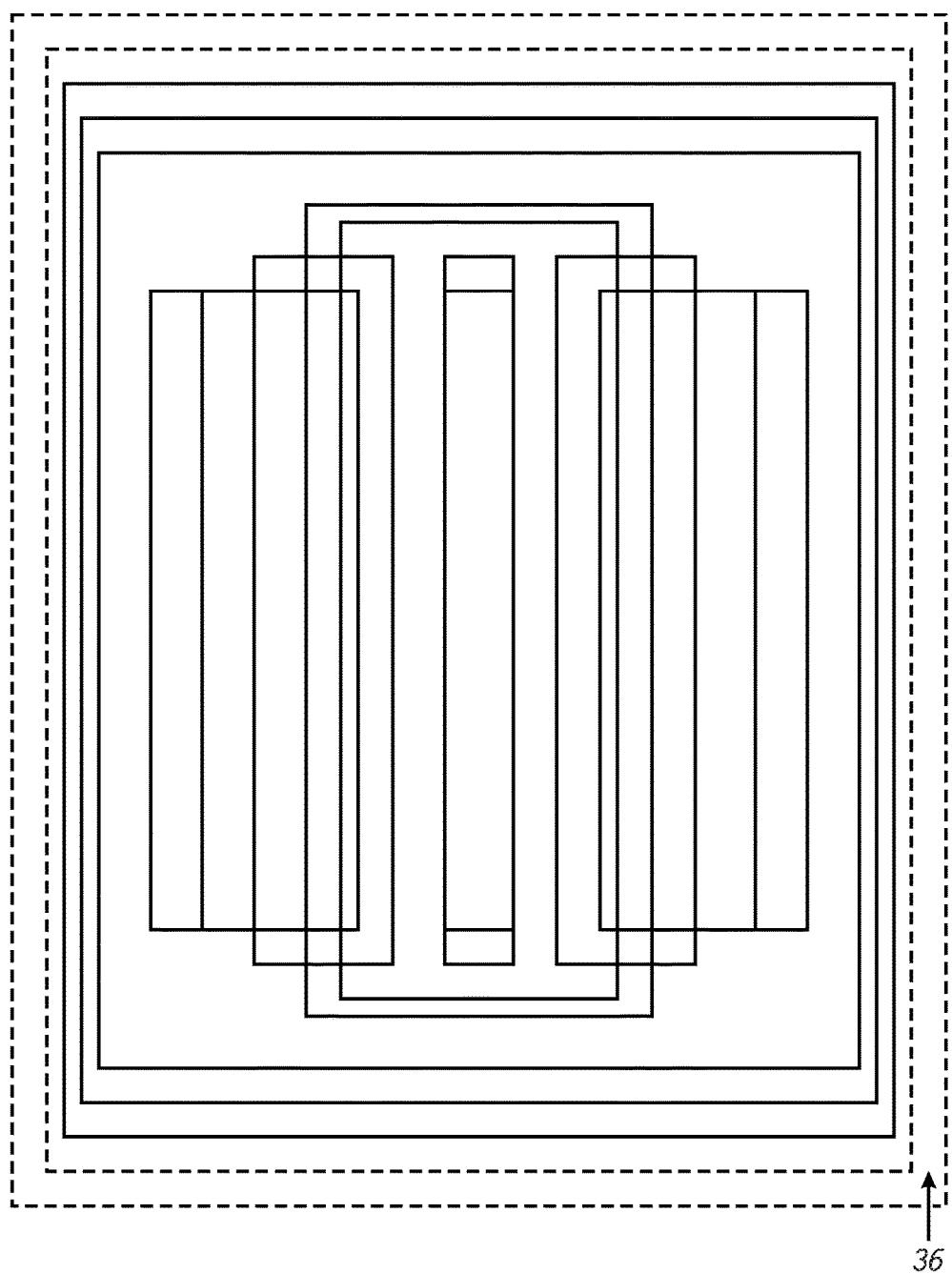
FIG. 3 illustrates the particular embodiment of FIG. 1 in plan view highlighting the location where a p-type well region resides.

A ring-shaped p-type region (p-well) region 36 is formed in the epitaxial layer 24. Region 36 may extend through the epitaxial layer 24 to the p-type blanket region 17. Alternatively, it may be separated from the p-type blanket region 17 by a p-epi layer (Not Shown). The relative layout location of the p-well region 36 is indicated at FIG. 3 by the portions of two dashed rectangles, wherein the region between the dashed rectangles represents the region where the ring-shaped p-well region 36 resides. The P-well region 36 has a dopant concentration in the range of $1\times10^{16}$ cm$^{-3}$ to $1\times10^{19}$ cm$^{-3}$.

Figure 4:
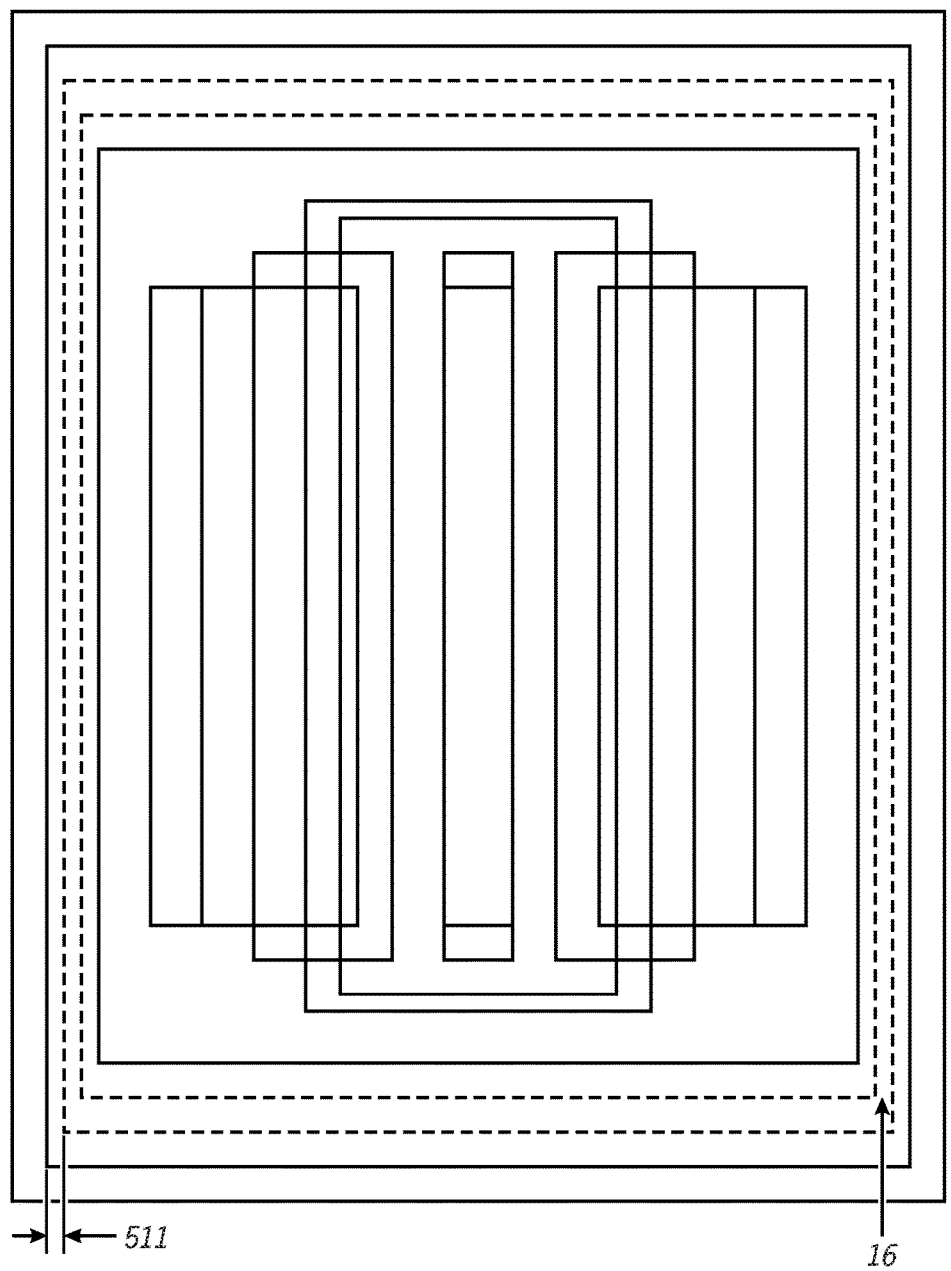
FIG. 4 illustrates the particular embodiment of FIG. 1 in plan view highlighting the location where an n-type isolation ring resides.

Device 20 includes an n-type isolation ring 16 formed by an n-type implant having an exemplary dopant concentration level of about $1\times10^{16}$ cm$^{-3}$ to $1\times10^{19}$ cm$^{-3}$. The isolation ring 16 extends to the buried layer 15, which extends laterally across (e.g., under) the bottom of the active regions of device area 34. The relative layout location of the isolation ring 16 is indicated at FIG. 4 by the portions of two dashed rectangles, wherein the region between the dashed rectangles represents the region where the isolation ring 16 resides. Together, the isolation ring 16 and the buried layer 15 form a junction isolation region that provides electrical isolation of device 20 from outside regions. To achieve a desired breakdown voltage between the device and its vicinity, the isolation ring 16 is spaced apart from the p-well 36 by a portion of the native epitaxial region 14, which is illustrated as distance 511 in FIG. 4. According to an embodiment, the isolation ring can extend to electrical contacts at the surface 38 (not shown), which can be used to provide a bias voltage during operation.

Figure 5:
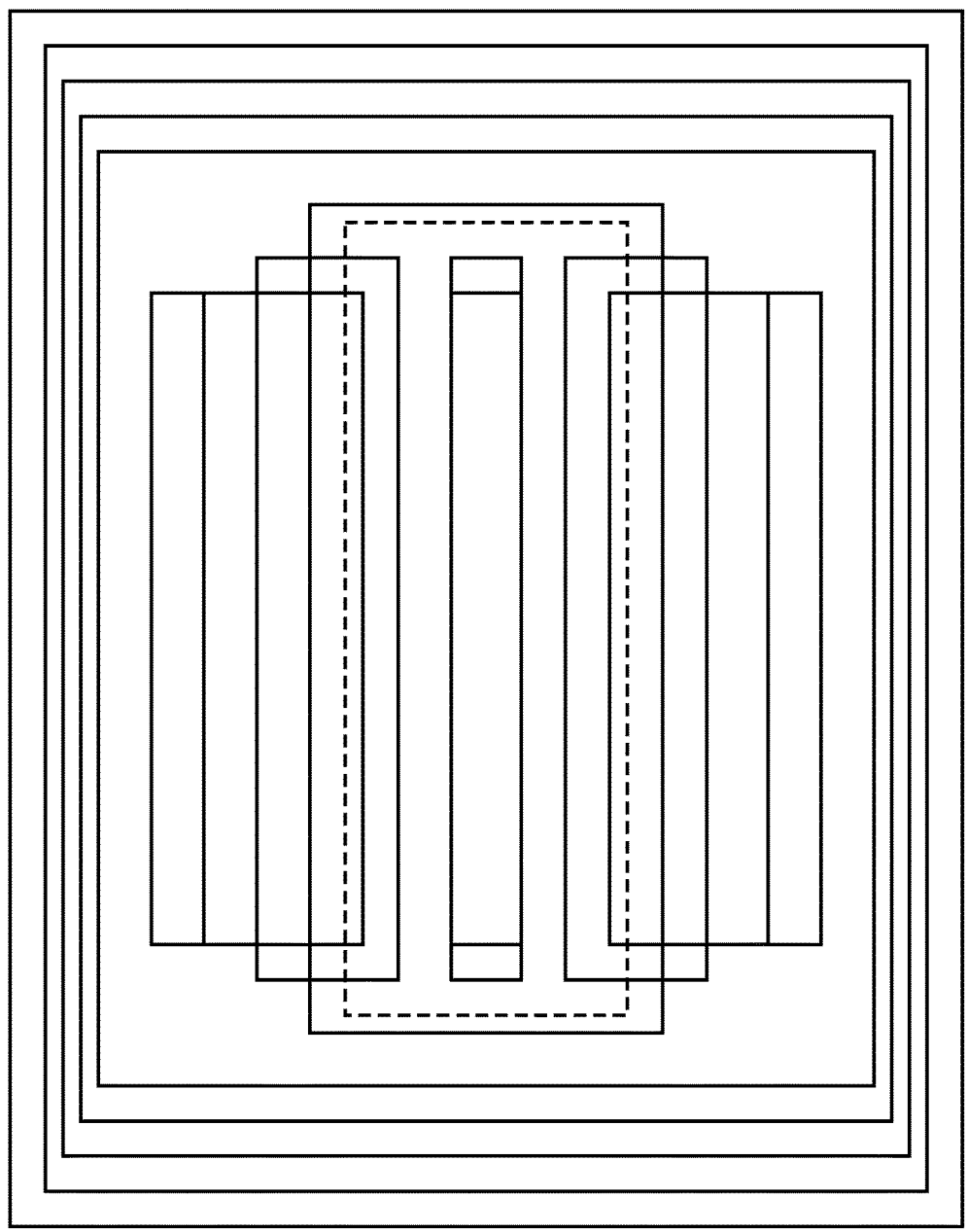
FIG. 5 illustrates the particular embodiment of FIG. 1 in plan view highlighting the location where p-type and n-type implants are performed.

The device 20 includes a high-voltage n-type region 80 (hvnw 80) at an upper portion of the epitaxial level 24 that is surrounded within the substrate by p-type region that includes an interface with a p-type region 81 in the lateral 99 and transverse 97 directions, and an interface with a portion 79 of p-epi region 70 in the transverse 97 and vertical 98 directions. The p-epi region 70 surrounds the three sides of the combination of p-type region 81 and hvnw region 80 that below the surface 38. The sides of the P-epi region 70 are surrounded within substrate 22 by the isolation ring 16. While the bottom of P-epi region 70 of substrate 22 forms an interfaces with the buried layer 15. Formation of hvnw 80 and p-type region 81 can reside at an upper portion of region 24 between the p-doped epi regions 70/79 in a lateral direction, wherein a p-n interface is formed between the each of the illustrated p-type regions 70/79/81 and hvnw 80 regions. The hvnw 80 can be a high-voltage well that is configured for high-voltage operation, and can have an exemplary dopant concentration level of about $5\times10^{15}$ cm$^{-3}$ to $5\times10^{18}$ cm$^{-3}$ that can be formed using conventional and proprietary techniques known to those skilled in the art. The p-type region 81 can have an exemplary dopant concentration level that is about $1\times10^{15}$ cm$^{-3}$ to $5\times10^{18}$ cm$^{-3}$ and can be formed using conventional and proprietary techniques known to those skilled in the art. According to an embodiment, the hvnw 80 and the p-type region 81 can be formed as part of a chain implant process. The region of device 20 exposed to the hvnw 80 implant and to the p-type region 81 implant is indicated at FIG. 5 by the dashed rectangle, wherein the area of the dashed rectangle represents the region receiving the implants. Note that other implants within the hvnw 80 region, such as n-type drain region 52 described below, will result in regions having different doping concentrations, see FIG. 1, as will be described in greater detail herein.

Figure 6:
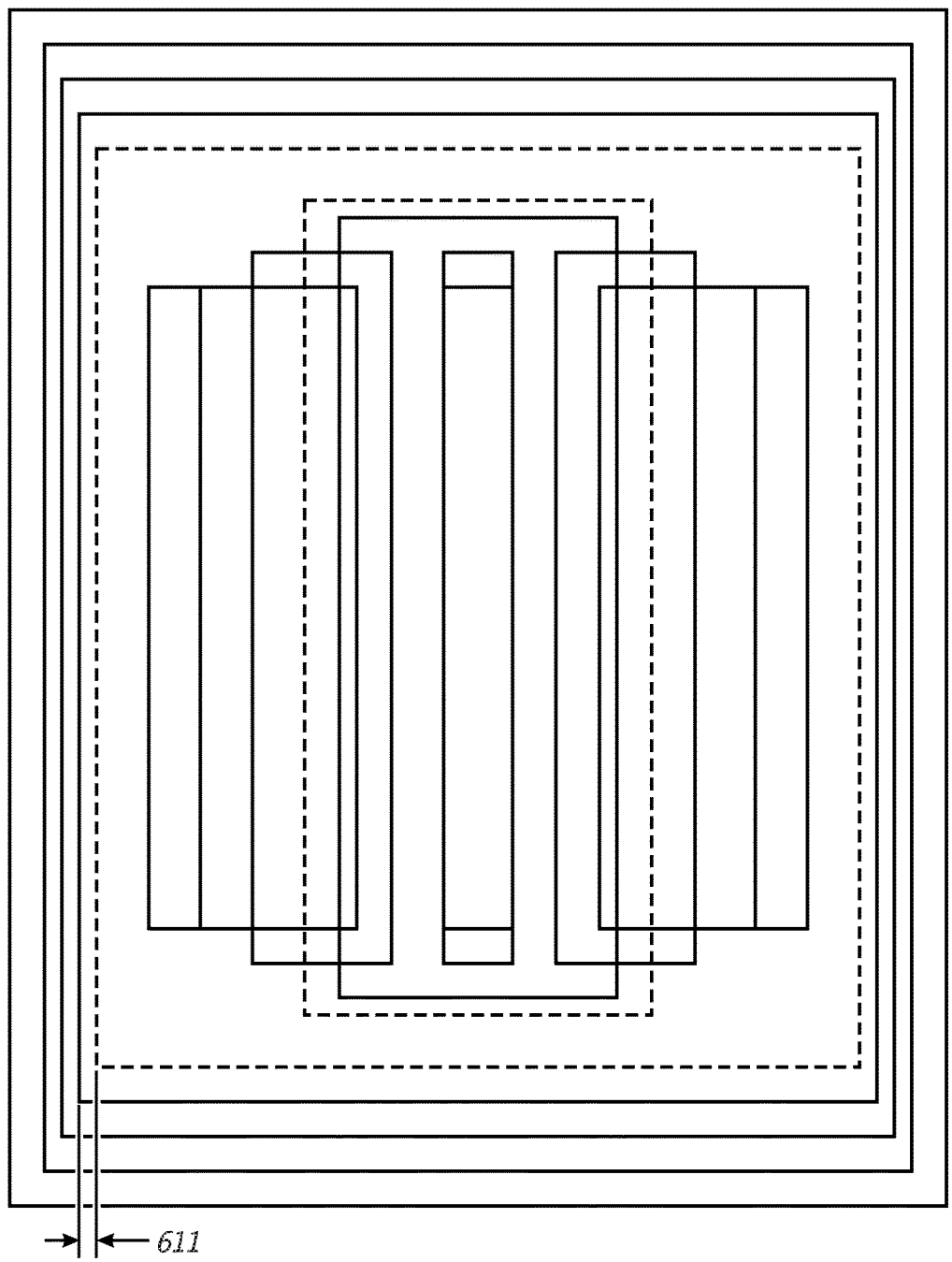
FIG. 6 illustrates the particular embodiment of FIG. 1 in plan view highlighting the location where a p-type doped region of a particular doping concentration resides.

As shown in FIG. 1, device 20 includes high voltage p-type region 44 (hvpw 44) at the level 24 of semiconductor substrate 22 between the hvnw region 80 and the ring isolation structure 16. A specific embodiment of a plan view of p-type region 44 is illustrated at FIG. 6, in which hvpw is single concentric region, defined by concentric rectangles, as illustrated at FIG. 6. In other embodiments each hvpw 44 could be formed by separate left and right rectangular regions, e.g., without the interconnecting regions shown at FIG. 6.

Hvpw 44 can be a high-voltage well that is configured for high-voltage operation and 44 can have an exemplary dopant concentration level of about $1\times10^{16}$ cm$^{-3}$ to $1\times10^{19}$ cm$^{-3}$ and can be formed using conventional and proprietary techniques known to those skilled in the art. Hvpw 44 can be spaced apart in a vertical direction 98 from the buried layer 15 by a distance in the range of about 0 μm to 8 μm. Hvpw 44 can be spaced apart in the lateral direction 99 from hvnw 80 by a distance in the range of about 0 μm to 3 μm by epi portion 79. As illustrated, Hvpw 44 is spaced apart from the isolation ring 16 in the lateral direction 99 by a distance 611, which can be in the range of about 0 μm to 8 μm, and is selected based upon a desired breakdown voltage.

As described previously (FIG. 2), an isolation layer 66, also referred to as a Shallow Trench Isolation (STI) layer, is formed in the semiconductor substrate 22 and includes STI regions 71 and 75. The STI regions 71 are formed between the body contact region 46 and substrate contact region (not shown). In FIG. 1, a contact region for isolation ring 15/16 is not shown, but can be formed in device 20 at an opening of the STI regions 71. In an embodiment, STI regions 71 are formed abutting the p-well region 36 in the vertical direction 98, and extend in the lateral direction 99 to a location within the p-body 44 to provide additional isolation. It will be appreciated that the STI region 71 may be omitted, and that alternative isolation schemes can be used.

The lateral dimension of the STI regions 75 can vary from that shown. The depth of the various STI regions 66 (71, 75) can be the same or different. According to an embodiment, the depth (direction 98) of STI region 75 is in the range of 0.05 μm to 1 μm, and has a length (direction 99) in the range of 0.05 μm to 10 μm. According to an embodiment, a STI region 75 includes a vertical edge that abuts the drain region 52 and that extends laterally to a location underlying the gate structure 58.

Figure 7:
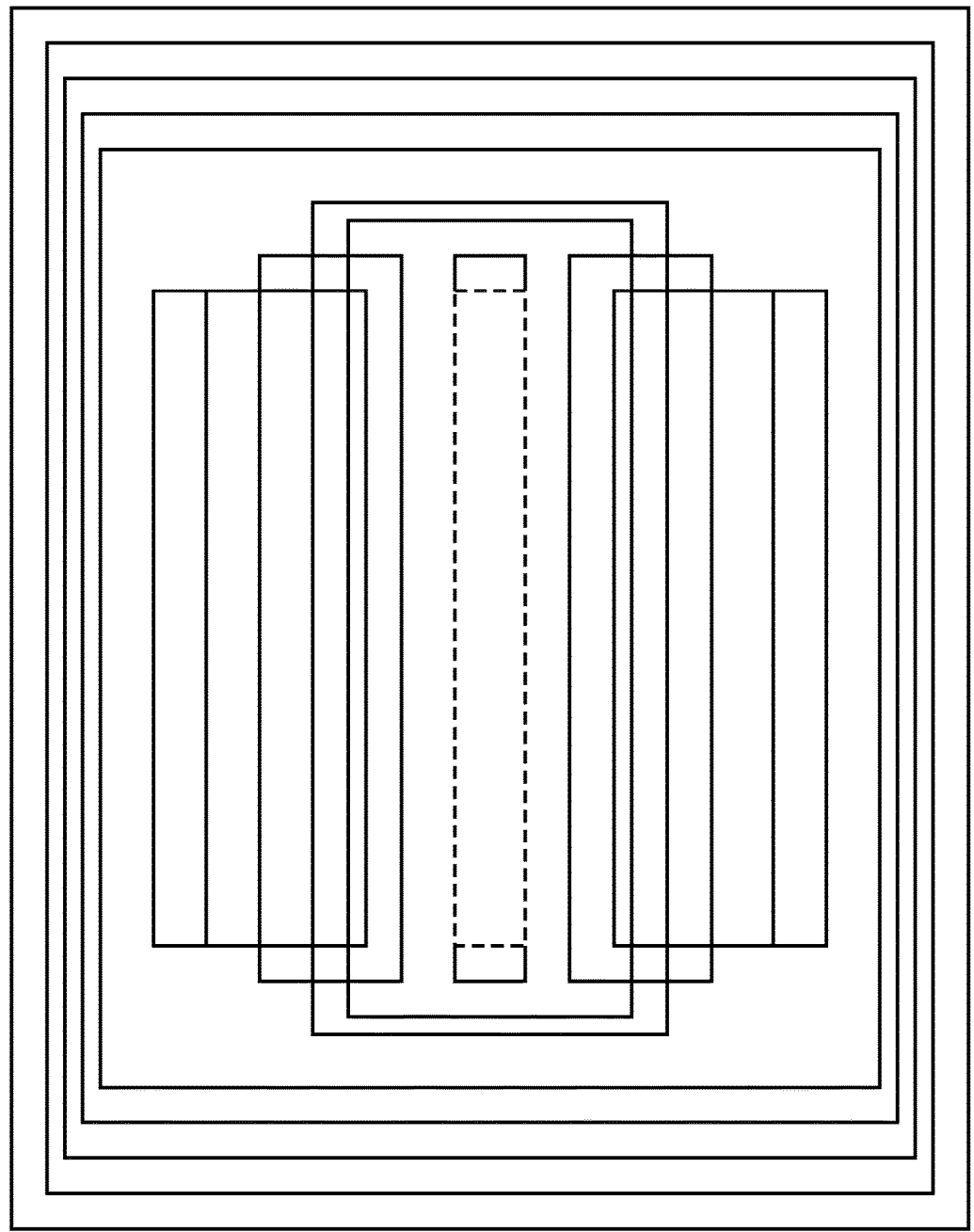
FIG. 7 illustrates the particular embodiment of FIG. 1 in plan view highlighting the location where an n-type drain region resides.

Semiconductor device 20 includes an n-type drain region 52 in the n-well region 80. Drain region 52 can have an exemplary depth, in the range of 0.05 μm to 0.5 μm, and an exemplary dopant concentration in the range of $1\times10^{19}$ cm$^{-3}$ to $1\times10^{23}$ cm$^{-3}$ sufficient to form ohmic contacts with the drain electrode, labeled "D", and be formed using conventional or proprietary processes as are known to those skilled in the art. In addition, the drain electrode can include a silicide region 65. The depth of the drain region 52 is typically less than the depth of the STI regions 75. The relative layout location the drain region 52 is indicated at FIG. 7 by the dashed rectangle, wherein the area of the dashed rectangle represents the drain region.

Figure 8:
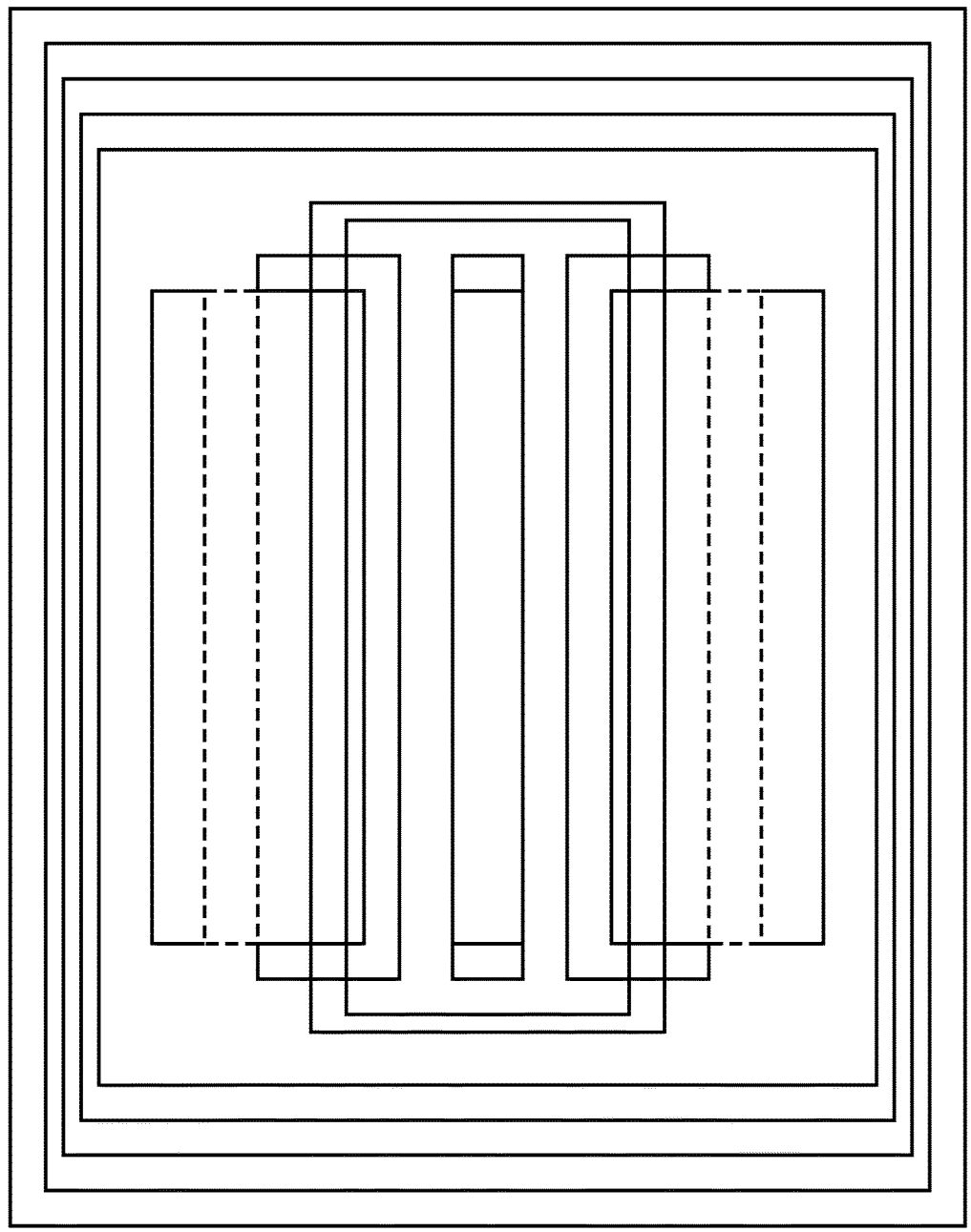
FIG. 8 illustrates the particular embodiment of FIG. 1 in plan view highlighting the location where n-type source regions of a particular doping concentration reside.

An N-type source region 50 resides in each corresponding p-type body region 44. The N-type source region 50 abuts its corresponding p-type body region 44 in the vertical direction and a lateral direction from the source region towards the drain region 52. A sidewall of source region 50 closest to drain region 52 can be aligned to the conductive structure 62 of a corresponding gate. The sidewall of each body region 44 furthest from the drain region 52 abuts the STI region 71. The source region 50 can have an exemplary depth (direction 98) in the range of about 0.05 µm to 0.5 µm, an exemplary length (direction 99) in the range of 0.1 µm to 1.0 µm, and an exemplary dopant concentration in the range of about $1 \times 10^{19}$ cm$^{-3}$ to $1 \times 10^{23}$ cm$^{-3}$ that is sufficient to form ohmic contacts with the source electrode, labeled "S". It will also be appreciated; the p-type body region 44 can include a p-type halo region (not shown). The relative layout location the source region 50 is indicated at FIG. 8 by the dashed rectangles, wherein the area of the dashed rectangles represents the source region.

Figure 9:
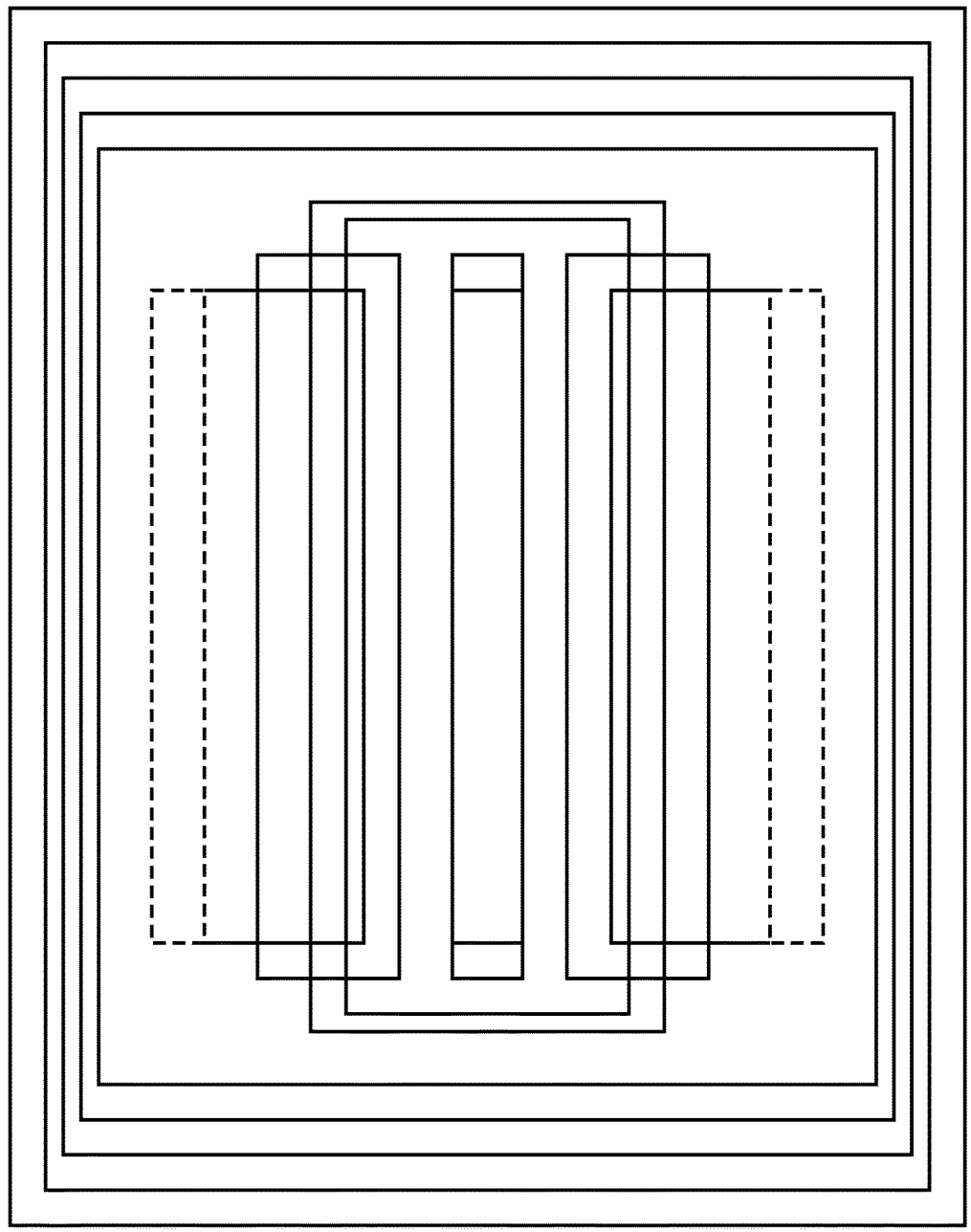
FIG. 9 illustrates the particular embodiment of FIG. 1 in plan view highlighting a location where a p-type doped region of a particular doping concentration resides.

Each body contact region 46 resides in the p-type body 44, and has a sidewall that abuts the STI region 71 and sidewall that abuts an adjacent source region 50. An exemplary dopant concentration of body contact region 46 is in the range of about $1 \times 10^{19}$ cm$^{-3}$ to $1 \times 10^{23}$ cm$^{-3}$, and is sufficient to form ohmic contacts with the body region 44, and with an electrode, labeled "B". The body contact regions can be formed using conventional or proprietary processes as are known to those skilled in the art. The relative layout location the body contact regions 46 is indicated at FIG. 9 by the dashed rectangles.

Figure 10:
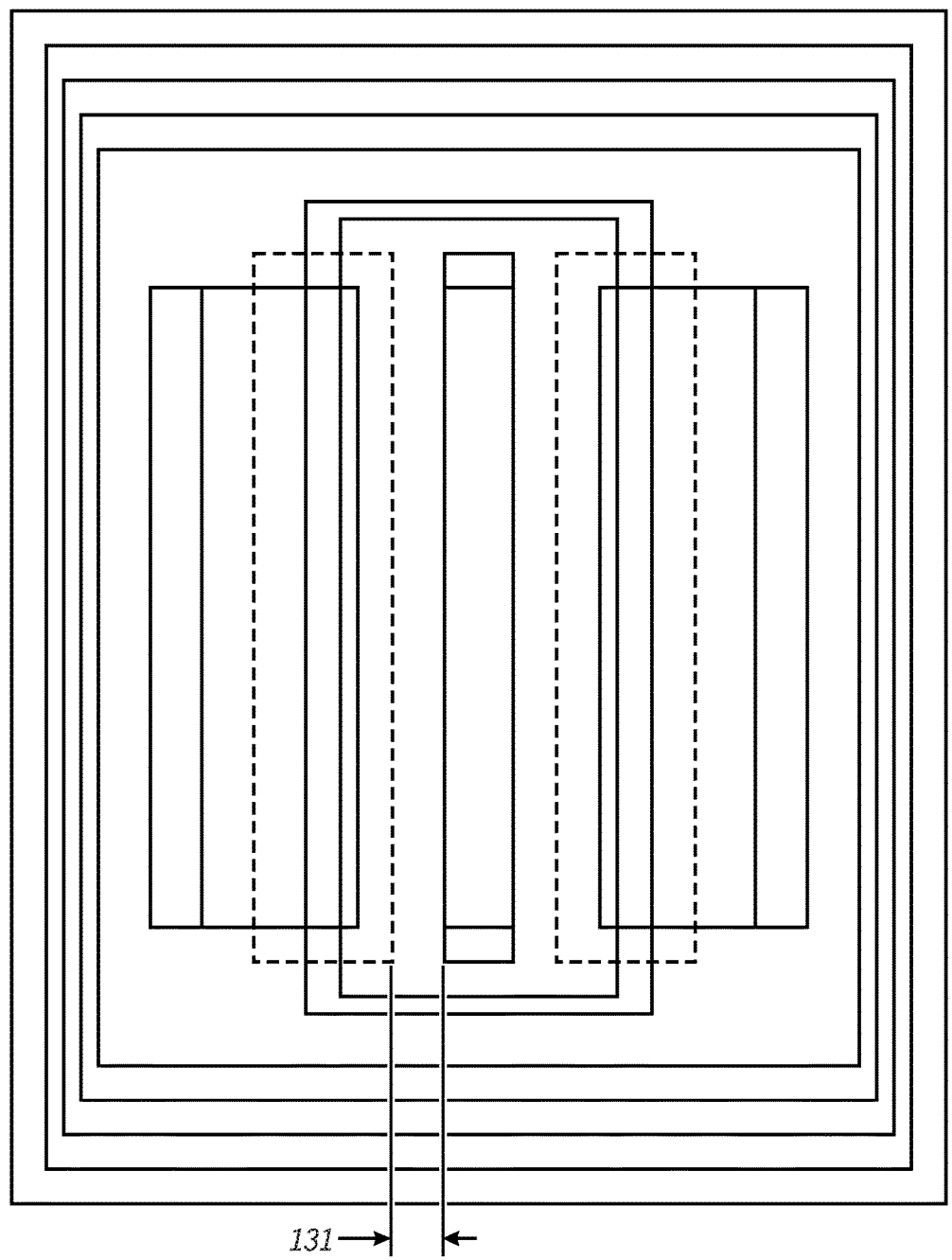
FIG. 10 illustrates the particular embodiment of FIG. 1 in plan view highlighting a location where gate structures reside.

Gate structures 58 of the semiconductor device 20 are formed over the surface 38 and include a conductive layer 62, a gate dielectric 60 and sidewall spacers 61 and 69. In the present embodiment, it is presumed that there are two separate gate structures 58 having a common width (direction 97). The sidewall spacers 61 overlie the source regions 50, the sidewall spacers 69 overlie the STI regions 75. The relative layout location of the conductive layer 62 of the gate structures 58 is indicated at FIG. 10 by the dashed rectangles. Also illustrated at FIG. 10 is the lateral dimension 131 from the conductive layer 62 to the drain region 52, which can be in the range of 0.1 µm to 9.5 µm.

Figure 11:
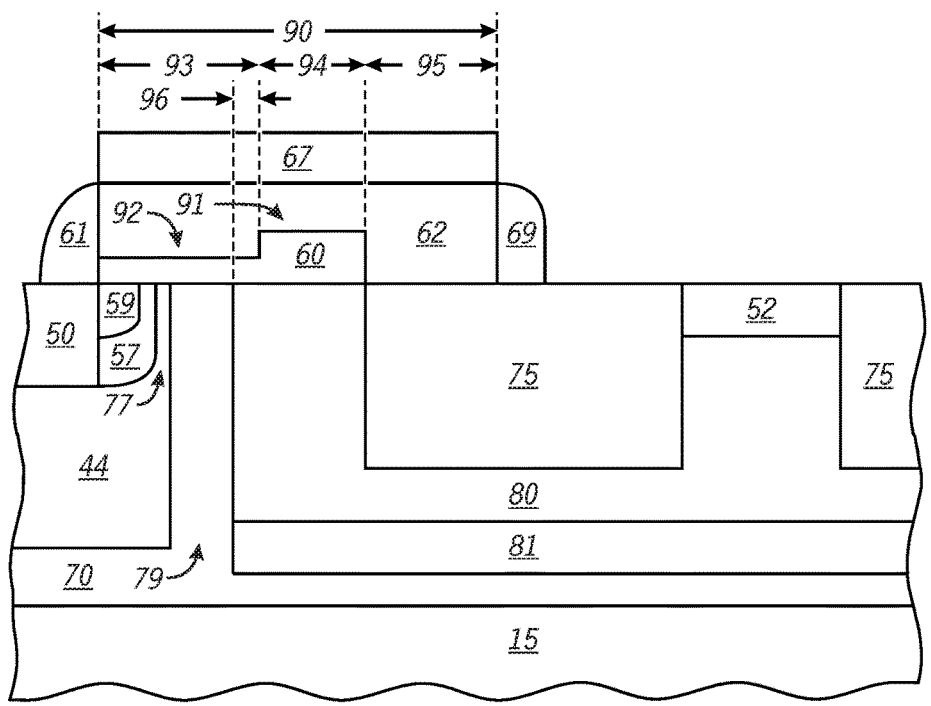
FIG. 11 illustrates a particular portion of the device of claim 1 in greater detail.
Figure 11:
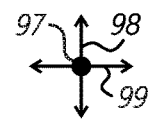
Figure 17:
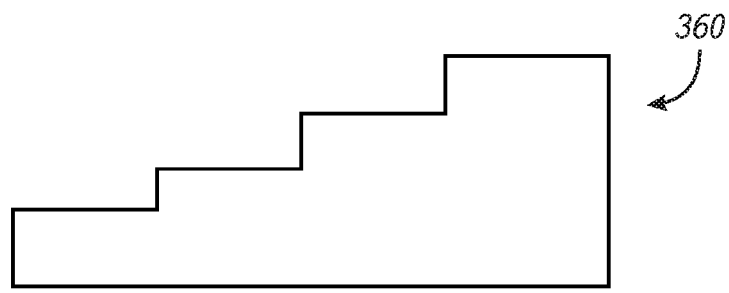
FIG. 17 illustrates an alternate embodiment of a gate dielectric.
Figure 18:
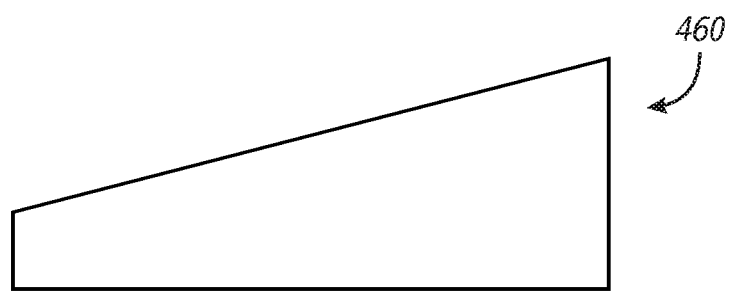
FIG. 18 illustrates an alternate embodiment of a gate dielectric.

FIG. 11 illustrates a portion of FIG. 1 in greater detail including gate structure 58. As illustrated, the gate dielectric 60 extends over the active silicon regions from the source region 50 to the nearest edge of STI 75. The gate dielectric 60 varies in thickness in the lateral direction, and therefore can be referred to as a varying gate dielectric, and gate structure 58 can be referred to as a variable dielectric gate structure. As illustrated, gate dielectric 60 varies in thickness by virtue of having a plurality of discrete levels, e.g., the level of portion 91 and the level of portion 92, that cause the gate dielectric 60 to have a feature resembling a step. Such a gate dielectric can be referred to herein as a step-type gate dielectric, and can included a plurality of steps, as shown by gate dielectric 360 of FIG. 17. In an alternate embodiment, the gate dielectric can continuously vary in the lateral direction to form a ramp-like structure, as shown by gate dielectric 460 of FIG. 18. Such a gate dielectric can be referred to as a continuously varying gate dielectric.

As illustrated, the gate dielectric 60 includes a first portion 91 and a second portion 92. The first portion 91 is illustrated as being aligned to the STI region 75 though in other embodiments, the gate dielectric or other dielectric, could extend to overlie the STI region 75. The first portion 91 and is thicker than the second portion 92, which can be aligned with the source region 50. The first portion 91 can have an exemplary thickness (direction 98) in the range of about 1.1-60 nm. The second portion 92 can have an exemplary thickness (direction 98) in the range of about 1.0-50 nm. Within this range, the thickness of the second portion 92 can be greater than 2.0 nm, 4.0 nm, 8.0 nm, 15.0 nm, 20.0 nm, 25.0 nm or 30.0 nm. Within this range, the thickness of the second portion 92 can be less than 2.0 nm, 4.0 nm, 8.0 nm, 15.0 nm, 20.0 nm, 25 nm, or 30.0 nm. According to an embodiment, the ratio of the thickness of the first portion 91 to the second portion 92 can be in the range of 1.1:1 to 9:1. According to another embodiment, the difference in thickness between the first portion and the second portion can be 1.0 nm, or greater. A lateral dimension 93 from the source region 50 to the first portion 91 of the gate dielectric 60 can be in the range of 0.1-10 µm. A lateral dimension 94 from the STI region 75 to the second portion of the gate dielectric 60 can be in the range of 0.05-5 µm. A lateral dimension 95 defined by the location of the furthest edge of the conductive gate 62 to the edge of the STI region 75 closest the source region 50, and can be in the range of 0.05-9.5 µm. A lateral dimension 96 defined by the location of the first portion 91 to the interface between the p-type region 79 and the hvnw region 80 can be in the range of −5.0-5.0 µm. It will be appreciated that while the gate dielectric is not shown as residing over STI region 75, in an alternate embodiment additional gate dielectric could be formed to overlie STI region 75. Also illustrated at FIG. 11 is a p-type halo region 57 and an n-type lightly doped drain (LDD) region 59. The halo region 57 can have a doping concentration in the range of about $1 \times 10^{17}$ cm$^{-3}$ to $1 \times 10^{20}$ cm$^{-3}$. The LDD region 59 can have a doping concentration in the range of about $1 \times 10^{17}$ cm$^{-3}$ to $1 \times 10^{20}$ cm$^{-3}$, and can be spaced apart from the well region 80 in the lateral direction by a distance in the range of about 0.1 µm to 10.0 µm. The source region 50, the halo region 57, and the lightly-doped source region 59 can be formed using conventional or proprietary processes as are known to those skilled in the art.

It will be appreciated that the step gate dielectric 60 can be formed by first forming a dielectric layer over the entire gate region having a thickness equal to the desired thickness of the first portion 91 of the gate dielectric 60, and then performing a selective etch to remove a portion of that dielectric layer to obtain a gate dielectric of a second thickness that corresponds to desired thickness of the second portion 92 of the gate dielectric 60. In another embodiment, the step gate dielectric 60 can be formed by first forming a gate dielectric having a thickness equal to the desired thickness of the second portion 92 over the entire gate region, and then forming a protective mask over the second portion 92 and continuing to form the gate dielectric to a desired thickness at the first portion 91. In another embodiment, the step gate dielectric 60 can be formed by first forming a gate dielectric having a thickness equal to a certain value, and then performing a selective etch to remove the dielectric layer in the second portion of the gate dielectric 60, and then continuing to form the gate dielectric in the first portion 91 having a thickness equal to the desired thickness of the first portion 91 and in the second portion 92 having a thickness equal to the desired thickness of the second portion 92. In another embodiment, the gate dielectric comprises more than two portions with an increase of the thickness along the direction from the source region towards the drain region. In another embodiment, the gate dielectric is tapering and its thickness gradually increases from the source region to the drain region.

Device 20 is configured so that when the gate structure 58 is biased with a high potential, the channel regions 77 and the p-type epitaxial region 79 under the conductive layer 62 are inverted into n-type regions, allowing charge carriers to flow from the source region 50 toward the drain region 52 through regions 77, 79, and 80 when the drain is applied to a high voltage. In particular, device 20 is configured so that an inversion region is constructed under conductive layer 62 in the hvpw region 44 and epi portion 79, an accumulation region is formed in the hvnw region 80 underneath the conductive layer 62 of gate structure 58 near STI region 75, and a field drift region is formed in the hvnw region 80 under the STI region 75. Charge carriers also transport through these regions when they flow from the source to the drain during on-state operation. Therefore, during on-state operation, charge carriers transport from the channel region 77 to the drain 52 through the inversion region and the accumulation region under the conductive gate 62, and a drift region under the STI region 75. This configuration is advantageous in that the first portion 91 of the gate dielectric 60 can result in an improved BVdss by virtue of being relatively thick, while the second portion 92 of the gate dielectric 60 can maintain a lower threshold voltage by virtue of being relatively thin.

It will be appreciated, that the drift region of hvnw can be configured for depletion during operation to reduce the magnitude of the electric field in accordance with the reduced surface field (RESURF) effect to provide improved breakdown performance. For example, when a voltage is biased between the drain to source (Vds), one or more PN junctions form between the n-type regions (e.g., hvnw 80) and the p-type regions (e.g., the p-type epitaxial regions 70/79 and the buried p-type region 81) to establish a RESURF effect directed to decreasing the electric field in the drift region. It will be appreciated that the drift region may be depleted both laterally and vertically, at least in part, during off-state operation. A decreased electric field may increase the breakdown voltage (BVdss) of the device 20.

Figure 12:
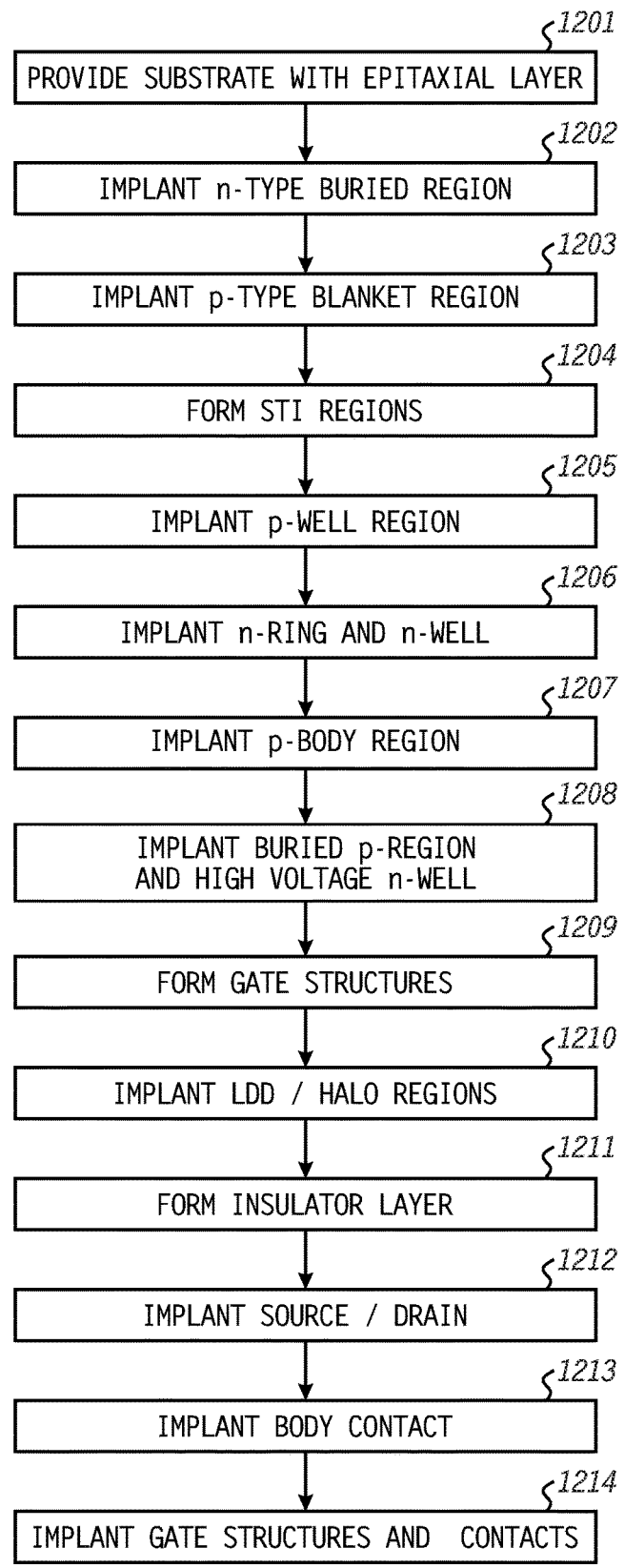
FIG. 12 illustrates a particular embodiment of a manufacturing flow for manufacturing the device of FIG. 1.

FIG. 12 illustrates a flow diagram that indicates an exemplary manufacturing flow for device 20, and subsequently described device. At block 1201, a substrate is provided that can include the bulk substrate and an overlying epitaxial layer of a common conductivity type, e.g. p-doped. At block 1202, a buried region, such as region 15 of FIG. 1, can be formed by implanting a dopant having the opposite conductivity type, e.g., n-doped, as the epitaxial region. At block 1203, a blanket region, such as region 17, can be formed by implanting a dopant having the same conductivity type as the epitaxial region. At block 1204, the STI regions are formed. At block 1205, a region, such as region 36, can be formed by implanting a dopant having the same conductivity type as the epitaxial layer. At block 1206 region 16 can be formed by implanting a dopant having the opposite conductivity type as the epitaxial layer. At block 1207, a body region, such as region 44, can be formed by implanting a dopant having the same conductivity type as the epitaxial layer. At block 1208, a buried p-type region 81 and a high voltage n-well region 80 can be formed by implementing a chain implant process. At block 1209, the gate structures are formed. At block 1210 implants are performed to form the LDD and Halo regions, such as regions 59 and 57. At block 1211, the silicide block layers are formed. At block 1212, source/drain region implants are performed using a dopant of the opposite conductivity type as the epitaxial region to form source/drain regions 50 and 52. At block 1213, body contacts, such as region 46, can be formed by implanting a dopant having the same conductivity type as the epitaxial layer. At block 1214, various other structures are formed to form a completed integrated circuit die that includes the various features described herein. It will be appreciated that the order of the particular flow is exemplary, and that the processing blocks could be performed in an alternate order.

Figure 13:
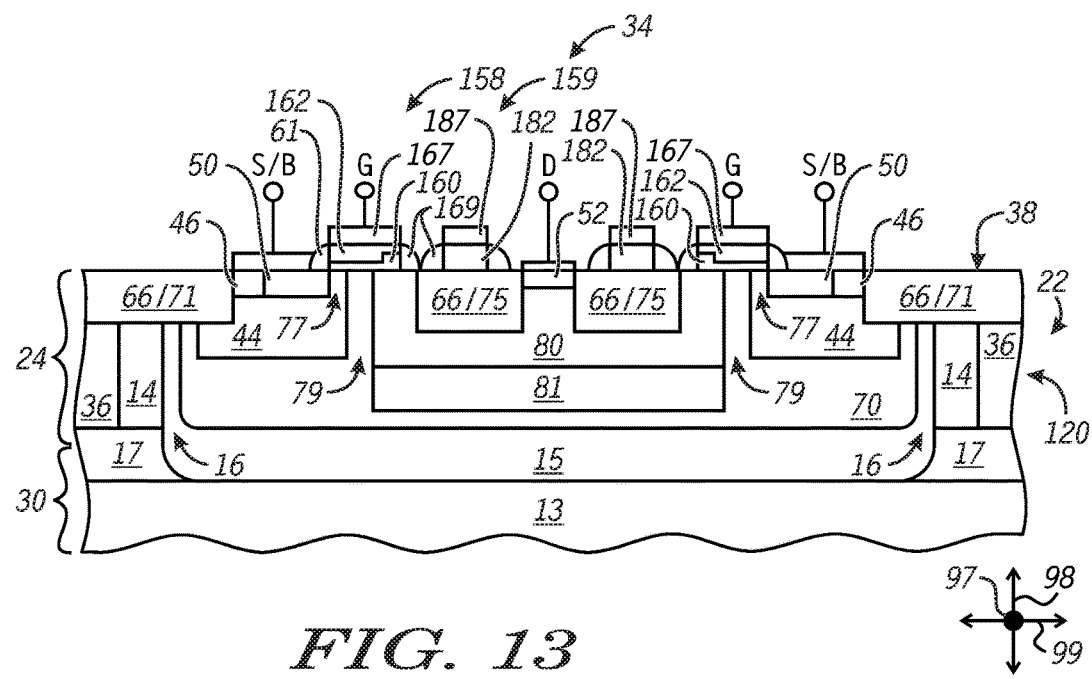
FIG. 13 illustrates a schematic cross-sectional view of a semiconductor device in accordance with an alternate embodiment having split gates.

FIG. 13 is a schematic cross-sectional view of a semiconductor substrate 22 having an n-channel LDMOS device 120. The layout of LDMOS device 120 differs from that of LDMOS device 20 of FIG. 1 in that LDMOS device 120 is a split gate implementation of an LDMOS device that includes two gate structures 158 and 159, on each mirrored half of the device 120, as opposed to the single gate implementation of FIG. 1 that includes a single gate structure 58. Features of device 120 that are substantially the same as features of device 20 maintain the same reference numerals and are not discussed in greater detail herein.

Gate structure 158 of the semiconductor device 120 is formed over the surface 38 and includes a conductive layer 162, a silicide region 167, a gate dielectric 160, and sidewall spacers 61 and 169. The gate dielectric 160 is a step gate dielectric, as will be discussed in greater detail below. In the present embodiment, there are two separate mirrored gate structures 158.

Gate structure 159 of the semiconductor device 120 is formed over the STI region 75 and includes a conductive layer 182, a silicide region 187, and sidewall spacers 181 (see FIG. 14) and 169. Gate 159 does not include a separate gate dielectric, as it is formed overlying a STI region 75, which is itself a dielectric region. It will be appreciated, however, that STI region 75 could include additional oxide. In the present embodiment, there are two separate mirrored gate structures 159. A portion of the sidewall spacer 169 corresponding to gate 158 overlies the hvnw region 80. Another portion of the sidewall spacer 169 corresponding to gate 159 overlies the STI region 75.

Figure 14:
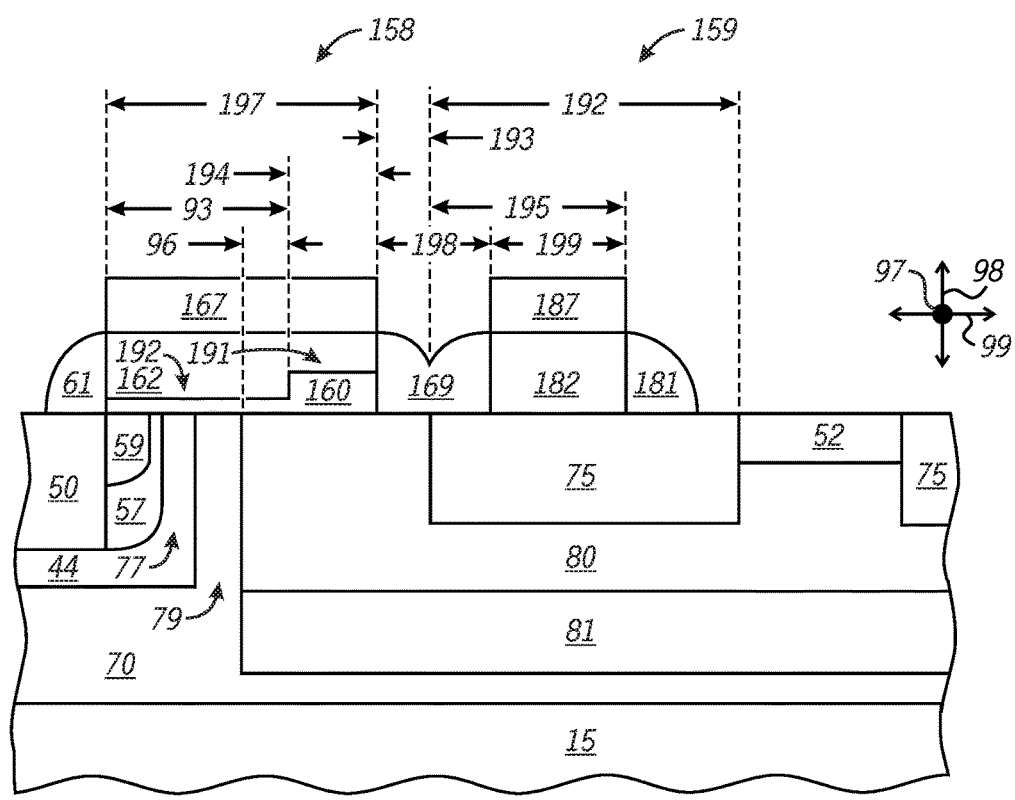
FIG. 14 illustrates a particular portion of the device of claim 13 in greater detail.

FIG. 14 illustrates a portion of FIG. 13 in greater detail including one each of gate structures 158 and gate structures 159. As illustrated, the gate dielectric 160 of gate structure 158 extends partially over the active silicon region from the source region 50 to a location overlying hvnw 80. A lateral dimension 193 from the conductive region 162 of gate 158 to the STI region 75 can be in the range of 0.05-1.0 μm. The gate dielectric 160 is a step gate dielectric that has a thickness that varies. As illustrated, the gate dielectric 160 includes a first portion 191 and a second portion 192. The first portion 191 overlies the hvnw 80 and is thicker than the second portion 192. The second portion 192 can be aligned with the source region 50 and extends to the first portion 191. The first portion 191 may or may not terminate over hvnw region 80. The first portion 191 can have an exemplary thickness (direction 98) in the range of about 1.5-60 nm. The second portion 192 can have an exemplary thickness (direction 98) in the range of about 1.0-50 nm. According to various embodiment, the ratio of the thickness of the first portion 191 to the second portion 192 can be in the range of 1.1:1 to 9:1. A lateral dimension 194 of the first portion 191 can be in the range of 0.05-5 μm. The lateral dimension 93 from the source region 50 to the first portion 191 of the gate dielectric 160 can be the same as previously described. A lateral dimension 96 from the interface between p-type region 79 and hvnw region 80 to the first portion 191 is in the range of −5.0-5.0 μm.

FIG. 14 also illustrates gate structure 159 in greater detail. Because gate structure 159 resides entirely over the STI region 75, no additional gate dielectric is illustrated. The gate 159 can have a lateral dimension of 0.1-10 μm. During operation, a common potential can be applied to both gate 158 and gate 159.

When a sufficiently large voltage is applied during operation, current can flow through a combination of an inversion, an accumulation and drift region of device 120. The inversion region resides in portion 77 of the p-type region 44 and in portion 79 of the p-type epi region 70 underlying the conductive portion 162. An accumulation region is in the hvnw region 80 underlying the conductive gate structure 162 and a field drift region is formed in hvnw region 80 under the STI region 75. By having the edge of gate 158 spaced apart from STI 75, in combination with the presence of gate structure 159, heavy impact ionization takes place at the edge of gate 158 in some scenarios, which can determine BVdss. To improve BVdss, a thicker gate dielectric at the first portion 191 of the gate dielectric 160 is used. However, because a thicker gate dielectric can result in a higher threshold voltage than desired, a thinner gate dielectric portion 192 is maintained over the channel regions of the gate structure 158.

Figure 15:
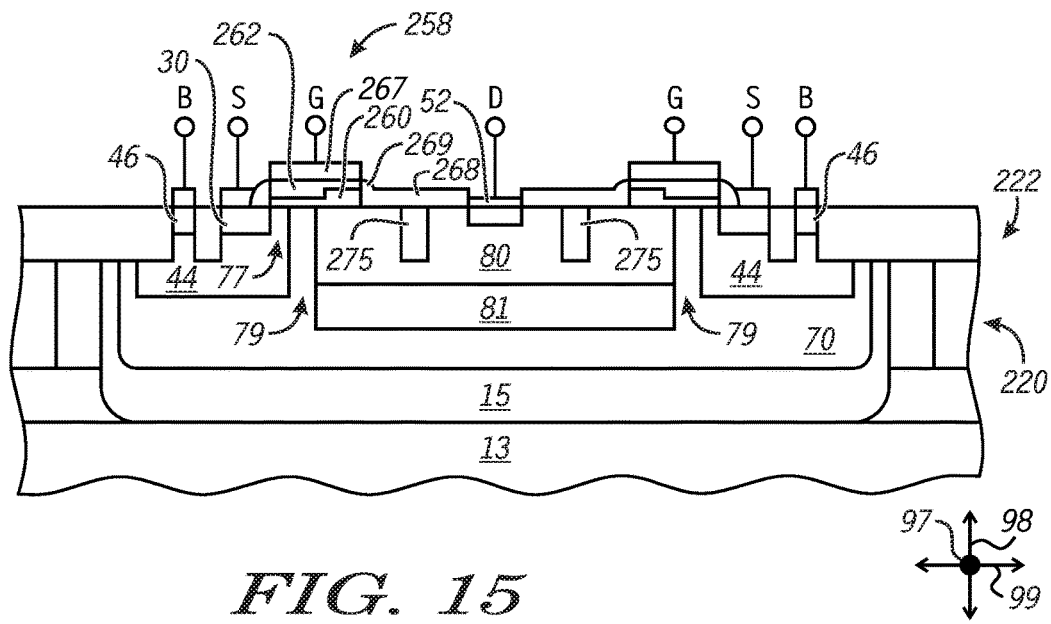
FIG. 15 illustrates a schematic cross-sectional view of a semiconductor device in accordance with an alternate embodiment having a relatively narrow STI region.

FIG. 15 is a schematic cross-sectional view of a semiconductor substrate 222 having an n-channel LDMOS device 220. The layout of LDMOS device 220 differs from that of LDMOS device 120 of FIG. 13 in that LDMOS device 220 is a single gate implementation, and that STI region 75 of Device 120 has been replaced with a narrow STI region 275. Features of device 220 that are substantially the same as features of device 120 maintain the same reference numerals and are not discussed in greater detail herein.

A dielectric layer 268 extends from the sidewall 269 of gate structure 258 to the drain region 52, and can act as a silicide block that prevents silicide from being formed overlying the portions of n-type region 80 between STI 275 and gate structure 258, and between STI 275 and drain 52. According to an embodiment, the depth (direction 98) of STI region 275 is in the range of 0.05 μm to 1 μm, and has a length 292 (FIG. 16) in the range of 0.05 μm to 1 μm. According to an embodiment, the length of STI region 275 is equal to or less than one-half of a dimension that extends in a lateral direction from drain 52 to an edge of conductive layer 262 that is closest to the drain 52, as will be discussed in greater detail below. The STI region 275 can be laterally centered between the drain 52 and the edge of conductive layer 262 that is closes to the drain 52. Alternatively, the STI region 275 can laterally located closer to one of the drain 52 or the edge of conductive layer 262. As with the other embodiment, the first portion 291 of gate dielectric 260 is thicker than the second portion 292 of the gate dielectric 260 to accommodate heavier impact ionization than would typically be present at the location underlying the first portion 291.

Figure 16:
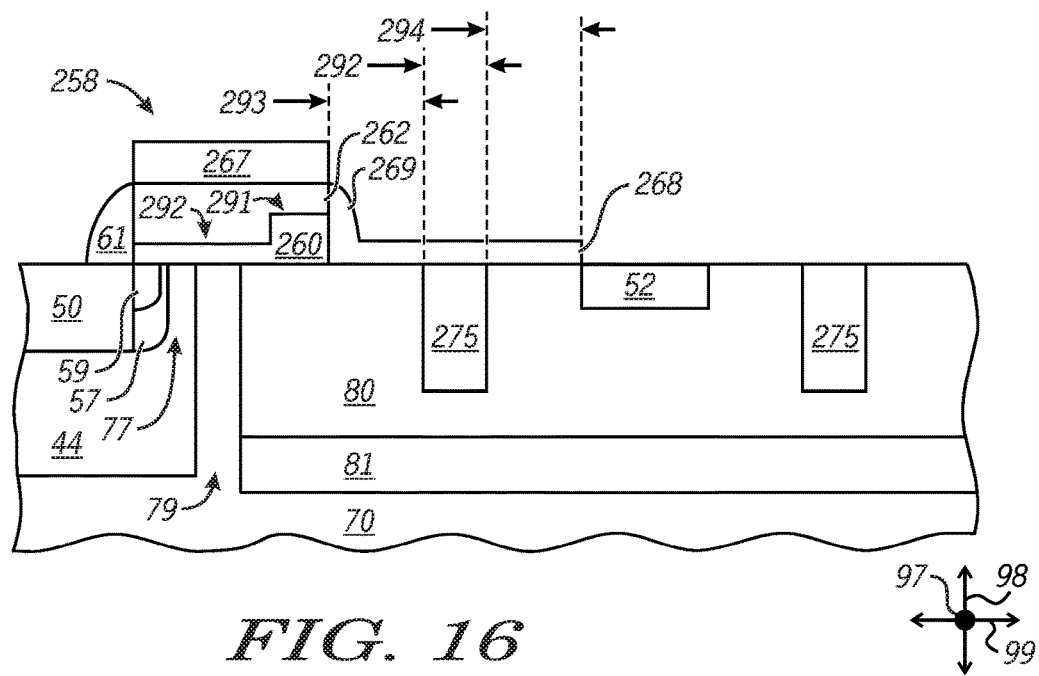
FIG. 16 illustrates a particular portion of the device of claim 15 in greater detail.

FIG. 16 illustrates a portion of FIG. 15 in greater detail including gate structure 258. As illustrated, the gate dielectric 260 of gate structure 258 extends partially over the active silicon region from the source region 50 to a location above hvnw 80, while remaining spaced apart from the narrow STI region 275. A lateral dimension 293 from the conductive region 262 of gate 158 to the STI region 275 can be in the range of 0.05-3.0 μm. The lateral dimension 294 between the drain 52 and the STI region 275 can also be in the range of 0.05-3.0 μm. The length of the STI region 275 in the lateral direction can be the minimum STI width allowed by a particular technology, or a width larger than the minimum allowed STI width. According to various embodiments, the length of the STI region 75 can be less than 1.0 μm, less than 0.8 μm, less than 0.6 μm, less than 0.4 μm, or less than 0.2 μm. The position of STI region 275 can be adjusted to meet different requirements. For example, when the STI region 275 moves closer to the drain region 52, a lower on-resistance is obtained at the expense of a lower breakdown voltage. Conversely, the breakdown voltage of device 220 increases as the STI region 275 is placed nearer the gate structure 58. However, this configuration also brings about a higher on-resistance. Similarly, the length of STI region 275 can be adjusted to change the on-resistance and the breakdown voltage of the device, wherein as the length of the STI region 275 increases so does the on-resistance and the breakdown voltage.

When a sufficiently large voltage is applied during operation, current can flow through a combination of an inversion, an accumulation and drift region. The inversion region resides in portion 77 of the p-type region 44 and in the p-type epi region 79 underlying the conductive portion 262. An active drift region is in the hvnw region 80 underlying the silicide block layer 269 and a field drift region is formed in hvnw region 80 under the STI region 275. having the edge of gate 258 spaced apart from STI 275, heavy impact ionization can occur at the edge of gate 258, which can affect BVdss. To improve BVdss, a thicker gate dielectric at the first portion 291 of the gate dielectric 260 is used. However, because a thicker gate dielectric can result in a higher threshold voltage than desired, a thinner gate dielectric portion 292 is maintained over the channel regions of the gate structure 258.

While the invention has been described above by reference to various embodiments, it should be understood that many variations may be made without departing from the scope of the invention. It is therefore intended that the foregoing detailed description be regarded as illustrative rather than limiting, and that it be understood that it is the following claims, including all equivalents, that are intended to define the spirit and scope of this invention. For example, while the step gate dielectric 60, 160, 260 has been illustrated to have a single step, it will be appreciated that the step gate dielectric 60, 160, 260 can have more than a single step along its lateral dimensions, or can be sloped in nature. The height variation between adjacent steps can be at least 0.1 nm. The ratio of a lowest height to a highest height of the gate dielectric can be in the range of 1.1:1 to 9:1. Also, while the devices described above have been described as being n-type devices, it will be understood that a p-type device can also be formed by forming regions of opposite conductivity type than those described.

Also, the specific embodiment disclosed above has been implemented as either a rectangular or ring-shaped structure. For example, when device 20 is implemented as a rectangular structure the gate structure 58 represent two distinct gates that are parallel to each other, the drain region is a rectangular shaped drain that is common to each of the two distinct gates, and the source regions 50 are two distinct regions, each associated with one of the two gates. When device 20 is implemented as a ring-shaped structure, the gate structure 58 can be a single ring-shaped structure, the drain region 52 remains a rectangular region, and the source region 50 is a ring-shaped region. In addition, it will be appreciated that in other embodiments, the device 20 can have multiple drains accompanied by additional gate and source regions. Also, it will be appreciated that devices can be formed having multiple drain regions and additional source regions and gate regions, wherein the features between each gate and its corresponding source are similar to that described herein.

In a first aspect, a semiconductor device can include a first region, a second region, a source region, a control gate structure, a shallow trench isolation (STI) region, and a third region. The first region being of a first conductivity type, and includes a drain region. The second region being of a second conductivity type, and abutting the first region in a lateral and in a vertical direction to form a first interface, between the first and second conductivity types, in the vertical and a transverse direction and a second interface in the lateral and transverse directions, respectively, the drain region spaced apart from the first and second interfaces, the first and second conductivity types having opposite conductivity. The source region being of the first conductivity type, and abutting the second region in the vertical direction. The control gate structure including a conductive layer overlying a gate dielectric, the gate dielectric having a first thickness at a first portion and a second thickness at a second portion, the first portion being closer to the drain region than the second portion, and the first portion of the gate dielectric having a thickness greater than the second portion of the gate dielectric, the conductive layer being spaced apart from the drain region in the lateral direction. The STI region having a second dimension in the lateral direction, and that abuts the first region between the source region and the drain region in the vertical and lateral directions, and is spaced apart from the source region. The third region of the first conductivity type abutting the second region in the vertical, lateral, and transverse directions.

In one embodiment of the first aspect, the semiconductor device further includes a split gate structure between the drain region and the control gate structure, and comprising a conductive layer overlying the STI region. In a more particular embodiment of the first aspect, the conductive layer of the split gate abuts the STI region.

In another embodiment of the first aspect, a portion of the conductive layer extends over the STI region in the lateral direction.

In a further embodiment of the first aspect, no portion of the gate dielectric extends over the STI region in the lateral direction. In a more particular embodiment, the first aspect also includes the gate dielectric being aligned to the STI region. In another more particular embodiment, the first aspect also includes the gate dielectric being spaced apart from the STI region in a lateral direction. In yet another more particular embodiment, the semiconductor device of the first aspect also includes a split gate structure between the drain region and the control gate structure, and includes a conductive layer overlying the STI region.

In yet a further embodiment of the first aspect, a lateral dimension of the STI region is less than one-half of a lateral dimension from the drain region to the edge of the gate nearest the drain region.

In yet another further embodiment of the first aspect, the gate dielectric is a step-type gate dielectric, and the thickness of the second portion of the gate dielectric is less than 50 nm and the difference between the thickness of the second portion and the thickness of the first portion of the gate dielectric is at least 1 nm.

In yet a further embodiment of the first aspect, the gate dielectric is a step-type type gate dielectric having at least three of portions, including the first portion and the second portion, each portion of the plurality of portions at a different level.

In yet a further embodiment of the first aspect, the gate dielectric is a continuously varying-type gate dielectric.

In a second aspect, a method of forming a semiconductor device Includes, forming a first region, forming a second region, forming a control gate structure, and forming a first STI. The first region being formed of a first conductivity type. The second region being of a second conductivity type comprising a drain region and abutting the first region in a lateral and a vertical direction the first and second conductivity types having opposite conductivity. The source region being formed of a first conductivity type within the first region. The control gate structure being formed spaced apart from the drain region, and includes a conductive layer overlying a gate dielectric, a first portion of the gate dielectric having a first thickness and a second portion of the gate dielectric having a second thickness, the first portion closer to the drain region than the second portion, and the first thickness being greater than the second thickness, the conductive layer being spaced apart from the drain region in the lateral direction. The first STI region being formed at a location of the second region between the source region and the drain region, and is spaced apart from the source region.

In an embodiment of the second aspect, the gate dielectric is a step-type gate dielectric, and the thickness of the second portion of the gate dielectric is less than 50 nm and the difference between the thickness of the second portion and the thickness of the first portion is at least 1 nm.

In another embodiment of the second aspect, the gate dielectric is a step-type gate dielectric having at least three portions, including the first portion and the second portion, each portion of the at least three portions being at a different level.

In a further embodiment of the second aspect, the gate dielectric is a continuously varying gate dielectric.

In yet a further embodiment of the second aspect, a split gate structure is formed between the drain region and the control gate structure, the split gate structure overlying the STI region. In a more particular embodiment, the first aspect also includes the control gate structure being formed to include the conductive layer of the split gate abutting the STI region.

In yet a further embodiment of the second aspect, forming the STI region includes the STI region having a lateral dimension that is less than one-half a lateral dimension from the control gate structure to the drain region.

In yet a further embodiment of the second aspect, forming the control gate structure includes forming the gate dielectric so that no portion of the gate dielectric extends over the STI region in the lateral direction.

It will be appreciated that various features can be added or omitted. The fact that some features have been explicitly identified as being able to be omitted does not mean all other described features are required, unless explicitly stated. Also, it will be appreciated that various features can be modified. For example, the buried layer 15 can be formed after the epi layer at level 24, and can reside in portions of both the epi-layer and the bulk substrate. While the present embodiment uses a bulk substrate, it will be appreciated that similar layout can be achieved on a silicon-on-insulator (SOI) substrate.

What is claimed is:

1. A semiconductor device comprising:
 a first region of a first conductivity type comprising a drain region;
 a second region of a second conductivity type abutting the first region in a lateral and in a vertical direction to form a first interface, between the first and second conductivity types, in the vertical and a transverse direction and a second interface in the lateral and transverse directions, respectively, the drain region spaced apart from the first and second interfaces, the first and second conductivity types having opposite conductivity;
 a source region of the first conductivity type abutting the second region in the vertical direction;
 a control gate structure comprising a conductive layer overlying a gate dielectric, the gate dielectric having a first thickness at a first portion and a second thickness at a second portion, the first portion being closer to the drain region than the second portion, and the first portion of the gate dielectric having a thickness greater than the second portion of the gate dielectric, the conductive layer being spaced apart from the drain region in the lateral direction;
a shallow trench isolation (STI) region having a second dimension in the lateral direction, and that abuts the first region between the source region and the drain region in the vertical and lateral directions, and is spaced apart from the source region;
a third region of the first conductivity type abutting the second region in the vertical, lateral, and transverse directions.

2. The semiconductor device of claim 1 further comprising:
a split gate structure between the drain region and the control gate structure, and comprising a conductive layer overlying the STI region.

3. The semiconductor device of claim 2, wherein the conductive layer of the split gate abuts the STI region.

4. The semiconductor device of claim 1, wherein a portion of the conductive layer extends over the STI region in the lateral direction.

5. The semiconductor device of claim 1, wherein no portion of the gate dielectric extends over the STI region in the lateral direction.

6. The semiconductor device of claim 5, wherein the gate dielectric is aligned to the STI region.

7. The semiconductor device of claim 5, wherein the gate dielectric is spaced apart from the STI region in a lateral direction.

8. The semiconductor device of claim 5 further comprising:
a split gate structure between the drain region and the control gate structure, and comprising a conductive layer overlying the STI region.

9. The semiconductor device of claim 1, wherein a lateral dimension of the STI region is less than one-half of a lateral dimension from the drain region to the edge of the gate nearest the drain region.

10. The semiconductor device of claim 1, wherein gate dielectric is a step-type gate dielectric, and the thickness of the second portion of the gate dielectric is less than 50 nm and the difference between the thickness of the second portion and the thickness of the first portion of the gate dielectric is at least 1 nm.

11. The semiconductor device of claim 1, wherein the gate dielectric is a step-type type gate dielectric having at least three of portions, including the first portion and the second portion, each portion of the plurality of portions at a different level.

12. The semiconductor device of claim 1, wherein the gate dielectric is a continuously varying-type gate dielectric.

13. A method of forming a semiconductor device comprising:
forming a first region of a first conductivity type;
forming a second region of a second conductivity type comprising a drain region and abutting the first region in a lateral and a vertical direction the first and second conductivity types having opposite conductivity;
forming a source region of the second conductivity type within the first region;
forming a control gate structure spaced apart from the drain region comprising a conductive layer overlying a gate dielectric, a first portion of the gate dielectric having a first thickness and a second portion of the gate dielectric having a second thickness, the first portion closer to the drain region than the second portion, and the first thickness being greater than the second thickness, the conductive layer being spaced apart from the drain region in the lateral direction; and
forming, at a location of the second region between the source region and the drain region, a first shallow trench isolation (STI) region that is spaced apart from the source region.

14. The method of claim 13 wherein the gate dielectric is a step-type gate dielectric, and the thickness of the second portion of the gate dielectric is less than 50 nm and the difference between the thickness of the second portion and the thickness of the first portion is at least 1 nm.

15. The method of claim 13, wherein the gate dielectric is a step-type gate dielectric having at least three portions, including the first portion and the second portion, each portion of the at least three portions being at a different level.

16. The method of claim 13, wherein the gate dielectric is a continuously varying gate dielectric.

17. The method of claim 13 further comprising:
forming a split gate structure between the drain region and the control gate structure, the split gate structure overlying the STI region.

18. The semiconductor device of claim 17, wherein forming the control gate structure includes the conductive layer of the split gate abutting the STI region.

19. The method of claim 13, wherein forming the STI region includes the STI region having a lateral dimension that is less than one-half a lateral dimension from the control gate structure to the drain region.

20. The method of claim 13, wherein forming the control gate structure includes forming the gate dielectric so that no portion of the gate dielectric extends over the STI region in the lateral direction.

* * * * *